United States Patent [19]

Welch

[11] Patent Number: 4,696,093

[45] Date of Patent: Sep. 29, 1987

[54] FABRICATION OF SCHOTTKY BARRIER MOSFETS

[76] Inventor: James D. Welch, 10328 Pinehurst Ave., Omaha, Nebr. 68124

[21] Appl. No.: 872,147

[22] Filed: Jun. 9, 1986

[51] Int. Cl.⁴ .......................................... H01L 21/441
[52] U.S. Cl. .................... 437/176; 437/228; 437/247; 437/913
[58] Field of Search ............... 29/571, 578, 589, 590, 29/591

[56] References Cited

U.S. PATENT DOCUMENTS

| | | | |
|---|---|---|---|
| 3,617,824 | 11/1971 | Shinoda et al. | 148/187 |
| 4,619,038 | 10/1986 | Pintohovski | 29/590 |
| 4,638,551 | 1/1987 | Einthoven | 29/591 X |

OTHER PUBLICATIONS

Lebedev et al., *Soviet Physics-Semiconductors*, vol. 4, No. 11, May (1971), pp. 1900-1902.
Martinez et al., *Solid State Electronics*, vol. 23, Pergamon Press, Ltd., Gt. Brit., pp. 55-64.
Yacobi et al., J. Appl. Phys., 51(12), Dec. 1980, pp. 6424 and 6425.

*Primary Examiner*—George T. Ozaki
*Attorney, Agent, or Firm*—James D. Welch

[57] ABSTRACT

A method for fabricating MOSFET devices by a one mask, one etch process utilizing vacuum deposited chromium, silicon upon which is grown $SiO_2$ and an anneal process. An optional optimizing ion implantation and activating anneal step is also disclosed, as are two, and three, mask and etch procedures.

4 Claims, 6 Drawing Figures

FABRICATION OF SCHOTTKY BARRIER MOSFETS

TECHNICAL FIELD

This invention relates to fabrication of transistors, and more particularly to a method for fabrication of MOSFETs which requires a single mask and etch step, in conjunction with chromium deposition and an anneal, with optional ion implantation allowed for to optimize the resulting device. Two, and three mask and etch procedures are also disclosed.

BACKGROUND ART

Typical processes for fabrication of MOSFETs require that numerous steps be performed. A silicon substrate must have silicon dioxide $SiO_2$ grown upon its surface. The oxide must then be etched to open source and drain regions through which dopants are entered and driven in via high temperature diffusions. Next, further oxide etches must be performed to remove all but the gate and gate pad oxide, then a layer of metal, which is typically aluminum must be deposited and etched. An additional sinter anneal is normally performed to cause good electrical contact between the metal and the underlying silicon.

Methods which reduce the number of steps, or the complexity of fabrication, or the energy required to fabricate MOSFETs are always of interest. A method for fabrication of MOSFETs which could reduce the number of steps required to the growing of, and etching of silicon dioxide, the deposition of a metal, and the annealing of the result, would be of great utility.

In 1974 a thesis titled "DESIGN AND FABRICATION OF SUB-MICRON CHANNEL MOS. TRANSISTORS BY DOUBLE ION IMPLANTATION" was submitted by James D. Welch to the Electrical Engineering Department of Toronto University. Disclosed in that work was the procedure Mr. Welch developed for fabricating MOSFET devices via the implantation of Boron ions around deposited and etched chromium patterns atop of N type silicon upon which had been grown 1000Å of $SiO_2$. During his work, Mr. Welch investigated an MOS capacitor to determine how chromium interacts with $SiO_2$ during an anneal at 650° C. That temperature was of particular significance in the fabrication procedure. While investigating the MOS capacitor Mr. Welch discovered that chromium deposited on the back, unpolished side of the silicon substrate, when annealed at 650° C. formed a very good rectifying junction. Recently Mr. Welch had a computer search run for authority on the use of chromium and silicon as a system. No patents were discovered but two articles were turned up. The articles, "COMPOUND FORMATION BETWEEN SILICON AND CHROMIUM" by Yacobi, Szadkowski and Zukotynski, J. App. Phys., Dec., 1980; and "METALLURGICAL AND ELECTRICAL PROPERTIES OF CHROMIUM SILICON INTERFACES", by Martinez and Esteve, Solid State Electronics, 1980; document that the effect which Mr. Welch noted in his earlier work exists and is due to the formation of chromium disilicide $CrSi_2$. It is the benefit afforded by the diode junctions formed from $CrSi_2$, in conjunction with a facilitating device geometry, which the present method utilizes to produce MOSFETs in an economical and simple way. The minimal number of steps in the process also provides for enhanced yield of devices per substrate processed.

DISCLOSURE OF THE INVENTION

A single mask and etch procedure for fabrication of MOSFETs is achieved by taking advantage of the diode properties of $CrSi_2$ formed when chromium is annealed in contact with silicon at temperatures between 300° C. and 900° C. The preferred method of putting chromium and silicon in contact with each other is vacuum deposition. The method involves the growth of $SiO_2$ on a silicon substrate to a depth of approximately 2000Å (range 500Å to 6000Å), etching a pattern into the $SiO_2$ and depositing chromium on the surface thereof. If the chromium depth is limited to about 600Å, (e.g. approximately 0.33 times the depth of the $SiO_2$), then the chromium layer will be discontinuous. That is, the chromium deposited on top of the $SiO_2$ will not be in contact with that directly on the silicon. Annealing the resultant system results in the formation of diode junctions in the regions where the chromium contacts the silicon, but not in the regions where $SiO_2$ separates the chromium from the silicon.

The invention herein utilizes the above disclosed facts in conjunction with a clever device geometry, which is formed by etching $SiO_2$, to form MOSFET transistors. Additional steps can include the use of ion implantation to adjust threshold voltages, or to adjust source and drain junction geometry. If such ion implantation step(s) are performed, then ion activating anneal step(s) are also added. In the case of boron implantation the activating anneal temperature is approximately 900° C. Thus, it is preferable to perform any ion implant and activating anneal prior to the deposition of chromium, although it is possible to do one combined ion activating, $CrSi_2$ forming anneal.

The starting substrates can be N or P type (typically N type), doped at between $10^{13}/cm^3$ to $10^{18}/cm^3$, of any crystal orientation, but typically <100>, or possibly amorphous.

A variation of the basic method includes an etch into the silicon directly following the $SiO_2$ etch. This serves to deepen the surface topology depth change, between the top of the $SiO_2$ and the new surface of the silicon. The result makes it possible to increase the depth of the chromium deposited while still achieving discontinuity of the metal layer.

Other embodiments allow for a second oxide etch, the purpose being to allow production of a lower capacitance gate pad region, and/or a chromium etch which will serve to delineate device regions if the metal depth becomes too great to allow discontinuity.

The primary objective of the present invention is to provide a means for the fabrication of MOSFETs by an economical easy to practice process. The method relies on the properties of chromium when annealed in contact with silicon, and the fact that a discontinuous metal layer can be achieved when chromium is vacuum deposited onto a substrate, the surface of which has had $SiO_2$ grown thereon, and etched. The process also relies on the geometry of the $SiO_2$ etch. Said geometry providing for automatic delineation of the source and drain regions, and for the location of a gate between the drain and source regions, as well as pads for contacting the source, drain and gate.

BEST MODES FOR CARRYING OUT THE INVENTION

Figure 1:
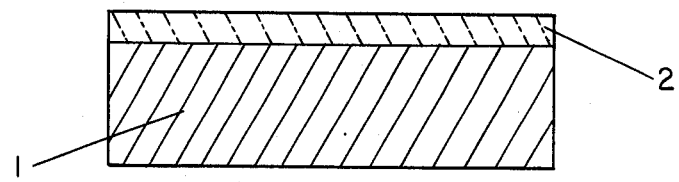
FIG. 1 shows a side elevational view of a silicon substrate with SiO2 shown on top thereof.

Referring now to FIG. 1, a silicon substrate (1) is shown in side view, upon which has been grown approximately 2000Å of SiO2 (2), (range 500Å to 6000Å). The substrate can be doped between $10^{13}/cm^3$ to $10^{18}/cm^3$, but typically $10^{15}/cm^3$, and can be of any crystal orientation, but typically <100>. Amorphous silicon might also be used.

Figure 2A:
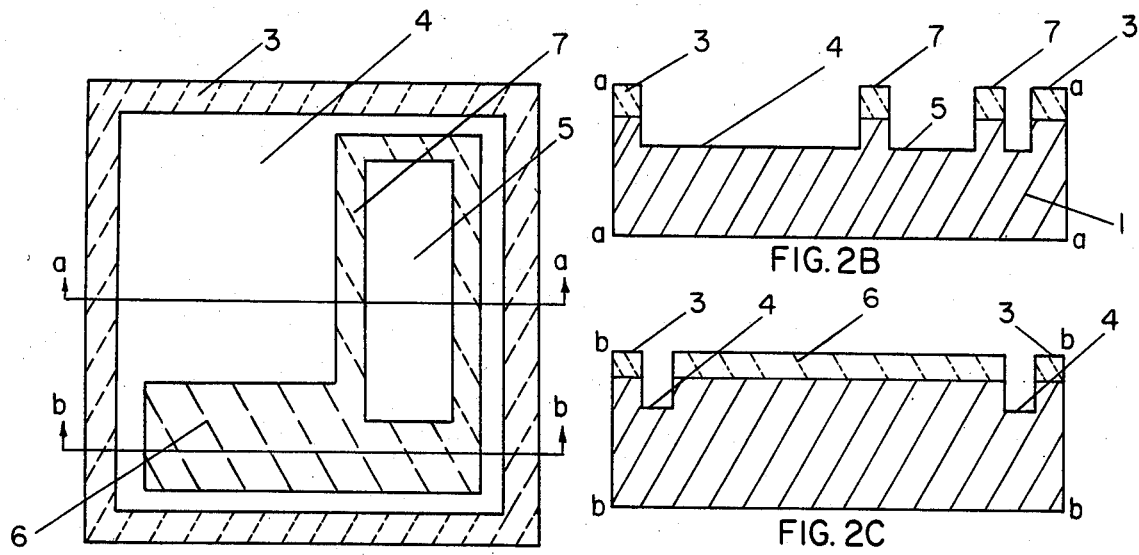
FIG. 2A shows a top view of a MOSFET prior to deposition of chromium but after an SiO2 etch.
Figure 2B:
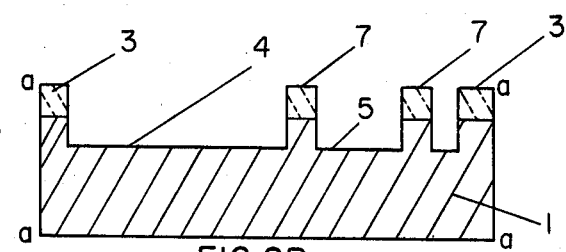
FIG. 2B shows a side elevational view of a MOSFET prior to chromium deposition but after a SiO2 and Si etch, which side view is taken at the location a—a on FIG. 2A.
Figure 2C:
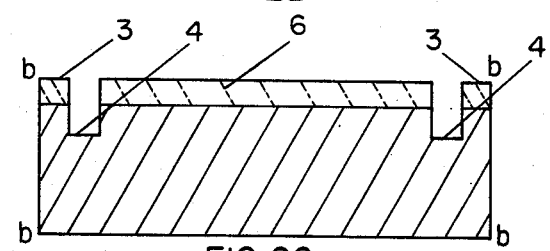
FIG. 2C shows a side elevational view of a MOSFET prior to chromium deposition but after an SiO2 and Si etch, which side view is taken at the point b—b on FIG. 2A.

After the SiO2 is grown, masks developed by standard photolithographic techniques are used in conjunction with standard photo resists and etchants, to etch a pattern in the SiO2, as indicated in FIGS. 2A, 2B and 2C. Note that after the SiO2 is etched, the silicon can also be etched to deepen the topology depth change, (e.g. see FIGS. 2B and 2C). After the etch, oxide remains only in the gate pad (6), channel (7), and device separation (3) areas. FIGS. 2A and 2B also show the pad regions, but no oxide remains in said areas.

At this point in the process ion implantation can be performed to set the eventual device's gate threshold voltage point, or to adjust the substrate bulk region junction geometries. Prior to the vacuum deposition of chromium to a depth of approximately 0.33 times the topology depth change distance of the etched SiO2, (or the combined depth of the etched SiO2 and the etched silicon), an anneal can be performed to place the implanted ions onto substitutional sites.

Figure 2D:
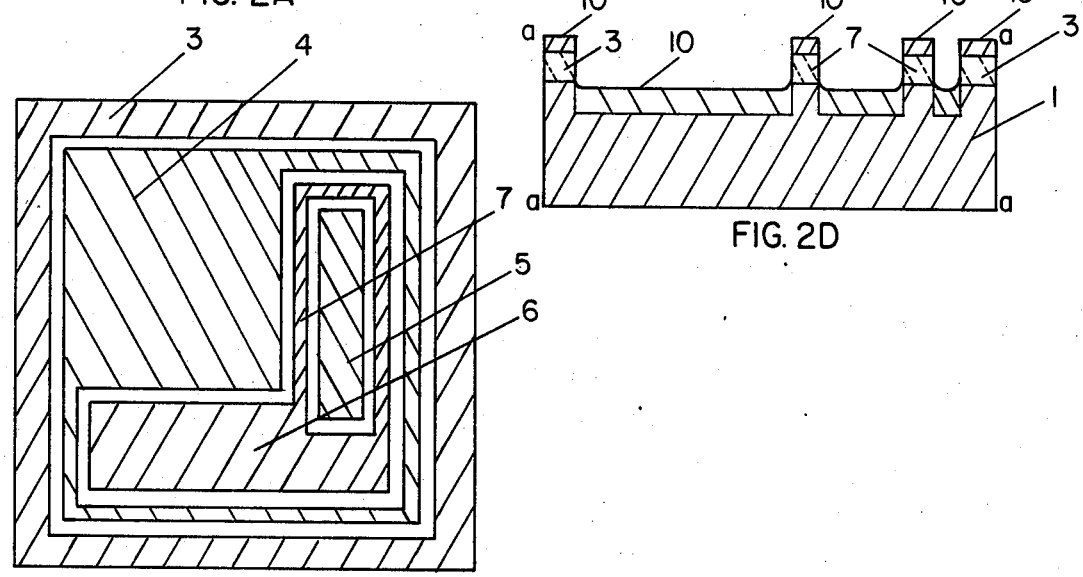
FIG. 2D shows a side elevational view of a MOSFET after chromium is deposited to a depth of approximately 0.33 times the distance from the top of the SiO2 to the Si. Note that the chromium on the SiO2 is not continuous with that on the Si.

The next step is to vacuum deposit chromium (10) on the surface of the silicon substrate to a depth no more than that which causes the metal upon the remaining SiO2, to be discontinuous with the chromium on the silicon in the source and drain regions, which were opened during the prior etching, (e.g. see FIG. 2D). An anneal at between 300° C. and 900° C., (typically 550° C.), is then performed to cause formation of CrSi2 in the source (5) and drain (4) regions and the resultant diode junctions.

An educated observation of FIGS. 2A, 2B, 2C and 2D will show that, an operable MOSFET transistor will exist, and can be probed in the pad regions (4), (5), and (6), and tested or used.

A second embodiment involves a process similar to that already described, but provides for the presence of a deeper gate oxide. The deeper oxide serves to reduce gate capacitance. In the above process, at the point where the oxide is grown, approximately 5000Å of oxide (range of 1000Å to 6000Å), is grown, rather than the typically 2000Å. An etch is then performed to remove all of the SiO2, except that in the gate-pad-to-be region (6), and in the device seperation (3) region. Next, an oxide growth is effected to a depth of approximately 800Å, (range 500Å to 2000Å), and then the process is continued as described above.

Figure 3:
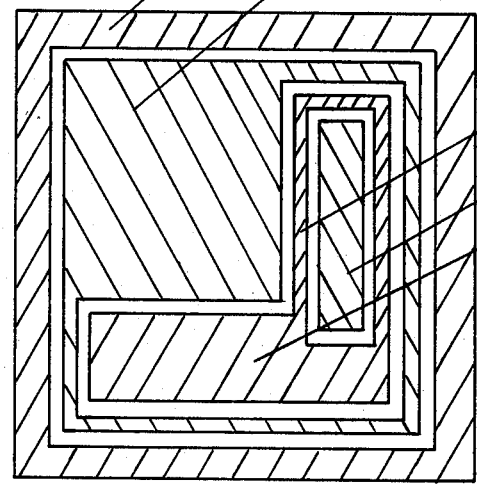
FIG. 3 shows a top view of a MOSFET upon which chromium has been deposited to a depth such that it is continuous but then has been subjected to an anneal and a source, drain and gate delineation etch.

A third embodiment involves an additional step which can be added to either of the above two embodiments. FIG. 3 demonstrates the extra step, which is the performance of a chromium etch, to delineate the final device metalization, if the metal was deposited to a depth too great, and it is present in a continuous fashion over the entire surface of the substrate. The chromium etch then, serves to delineate the source (5), drain (4) and gate pad (6), and gate (7) regions, and to delineate the devices (3).

It is to be understood that this disclosure describes steps which are presented in a definite order. This is not to be taken to mean that some variation in the order of the steps is beyond the scope of the invention. The optional ion implantation might be carried out after the metal deposition, for instance. The focus of the invention is in the use of the self defining device source, drain and gate regions, and in the use of the discontinuous metalization, and in the use of chromium as the metal. The later is the primary factor which makes the process workable. It is only because CrSi2 forms when annealed in contact with silicon, and because CrSi2 forms a usable diode junction with silicon that the present method is possible. The use of aluminum, for instance, which is the typical transistor metalization metal, leads to the formation of a eutectic combination of the aluminum and the silicon when annealed, and does not provide a probable metal in contact with a diode junction in the bulk of the substrate, if it is used in the present invention method. It is the surprising formation of a probeable metalized junction, in the above disclosed method which is the focus of the present invention.

The devices formed by the one mask and etch process will have channel lengths as short as photolithographic techniques will allow. Also, the resultant drain-source voltage curves will be flat as a result of the step nature of the diode junction formed, and because the silicon will be effectively more highly doped than will be the chromium, hence, the space charge region will extend primarily into the chromium as the drain-source voltage is increased.

It must be pointed out the the Figures present representative geometry. Any pattern which surrounds a source region with a gate oxide, and provides self arranged source, drain and gate regions, is to be considered equivalent.

Having hereby disclosed the subject matter of this invention, it should be obvious that many modifications, substitutions, and variations of the present invention are possible in light of the teachings. It is therefore to be understood that the invention may be practiced other than as specifically described, and should be limited in breadth and scope only by the claims.

I claim:

1. A single mask/etch method for fabricating MOSFETs comprising:
   selecting a silicon substrate;

growing $SiO_2$ on top of the silicon substrate to a depth appropriate for use as channel oxide under a gate;

etching the $SiO_2$ to the silicon to form a pattern comprising a source region surrounded by channel and gate $SiO_2$, which channel and gate $SiO_2$ is surrounded by a drain region, which drain region is surrounded by a device delineating $SiO_2$;

depositing chromium to a depth just under that which would cause the chromium on the $SiO_2$ to be continuous with that on the silicon in the etched source and drain regions so that the resulting metalization is discontinuous; and annealing the resulting system so that junctions form in the source and drain regions between the deposited chromium and the silicon in the source and drain regions.

2. A single mask etch method for fabricating MOSFETs as in claim 1, in which an additional silicon etch is performed directly following the $SiO_2$ etch, the same pattern being etched into the silicon as was etched into the $SiO_2$ so that the depth between the top of the $SiO_2$ and the silicon is increased.

3. A two mask/etch method for fabricating MOSFETs comprising:

selecting a silicon substrate;

growing $SiO_2$ on top of the silicon substrate to a depth appropriate for use as channel oxide under a gate;

etching the $SiO_2$ to form a pattern comprising a source region surrounded by channel and gate $SiO_2$, which channel and gate $SiO_2$ is surrounded by a drain region, which drain region is surrounded by a device delineating $SiO_2$;

depositing chromium to a depth sufficient to form a continuous metalization over the entire surface of the etched silicon substrate;

annealing the resulting system so that junctions form in the source and drain regions between the deposited chromium and the silicon; and etching the resulting system to delineate the source, gate-channel and drain regions.

4. A two mask/etch method of fabricating MOSFETs as in claim 3 in which an additional silicon etch is performed directly following the $SiO_2$ etch, the same pattern being etched into the silicon as was etched into the $SiO_2$ so that the depth between the top of the $SiO_2$ and the silicon is increased.

* * * * *